(12) United States Patent
Mukherjee et al.

(10) Patent No.: US 12,408,318 B2
(45) Date of Patent: Sep. 2, 2025

(54) SEMICONDUCTOR FORMATION USING HYBRID OXIDATION

(71) Applicant: Micron Technology, Inc., Boise, ID (US)

(72) Inventors: Somik Mukherjee, Boise, ID (US); Shen Hu, Boise, ID (US); Anish A. Khandekar, Boise, ID (US); Sau Ha Cheung, Boise, ID (US); Zhiqiang Xie, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/413,108

(22) Filed: May 15, 2019

(65) Prior Publication Data

US 2020/0365596 A1 Nov. 19, 2020

(51) Int. Cl.
*H10B 12/00* (2023.01)
*H01L 21/02* (2006.01)
*H01L 21/762* (2006.01)

(52) U.S. Cl.
CPC ..... *H10B 12/053* (2023.02); *H01L 21/02233* (2013.01); *H01L 21/76202* (2013.01); *H10B 12/34* (2023.02)

(58) Field of Classification Search
None
See application file for complete search history.

(56) References Cited

U.S. PATENT DOCUMENTS

| | | | |
|---|---|---|---|
| 7,524,750 B2* | 4/2009 | Nemani | H01L 21/76224 438/597 |
| 7,541,297 B2 | 6/2009 | Mallick et al. | |
| 7,662,693 B2 | 2/2010 | Bhattacharyya | |
| 7,875,529 B2 | 1/2011 | Forbes et al. | |
| 8,274,777 B2 | 9/2012 | Kiehlbauch | |
| 2006/0252228 A1 | 11/2006 | Jeng | |
| 2010/0099236 A1 | 4/2010 | Kwon et al. | |

FOREIGN PATENT DOCUMENTS

| | | |
|---|---|---|
| CN | 1858898 | 11/2006 |
| WO | 2004114366 | 12/2004 |
| WO | 2007001878 | 1/2007 |

* cited by examiner

*Primary Examiner* — Jack S Chen
(74) *Attorney, Agent, or Firm* — Brooks, Cameron & Huebsch, PLLC

(57) ABSTRACT

Methods, apparatuses, and systems related to forming a semiconductor using hybrid oxidation are described. An example method includes forming an opening to create an isolation region in a semiconductor substrate. The example method further includes depositing a first dielectric into the isolation region at a first oxidation rate. The example method further includes depositing a second dielectric into the isolation region at a second oxidation rate.

14 Claims, 9 Drawing Sheets

SEMICONDUCTOR FORMATION USING HYBRID OXIDATION

TECHNICAL FIELD

The present disclosure relates generally to semiconductor devices and methods, and more particularly to forming a semiconductor using hybrid oxidation.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), static random access memory (SRAM), synchronous dynamic random access memory (SDRAM), ferroelectric random access memory (FeRAM), magnetic random access memory (MRAM), resistive random access memory (ReRAM), and flash memory, among others. Some types of memory devices may be non-volatile memory (e.g., ReRAM) and may be used for a wide range of electronic applications in need of high memory densities, high reliability, and low power consumption. Volatile memory cells (e.g., DRAM cells) require power to retain their stored data state (e.g., via a refresh process), as opposed to non-volatile memory cells (e.g., flash memory cells), which retain their stored state in the absence of power. However, various volatile memory cells, such as DRAM cells may be operated (e.g., programmed, read, erased, etc.) faster than various non-volatile memory cells, such as flash memory cells.

DETAILED DESCRIPTION

Figure 1:
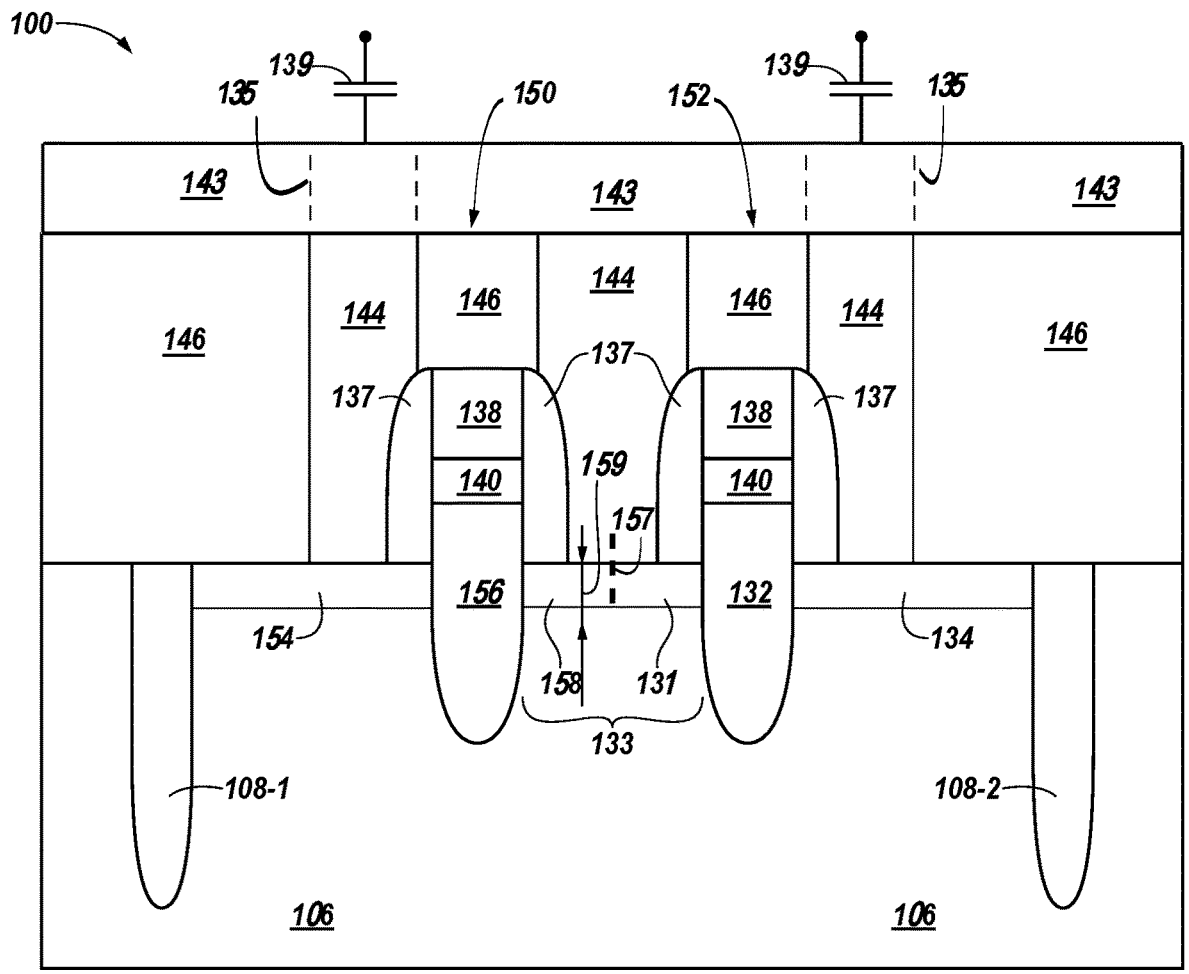
FIG. 1 is a cross-sectional view of a semiconductor apparatus with a transistor having asymmetric source/drain regions adjacent to isolation trenches in an example semiconductor fabrication process in accordance with a number of embodiments of the present disclosure.

The physical size of memory devices is being reduced as size constraints increase. Memory devices can include memory cells including a transistor and a storage element (e.g., a 1T1C (one transistor one capacitor) memory cell. The memory cells can be on pitch with other components of a memory devices such as sensing circuitry (e.g., sense amplifiers) and sub wordline drivers (SWDs). As the pitch of these other components of the memory device decreases, the pitch of transistors of the memory device decreases as well. Decreasing the pitch of the transistors decreases the space between adjacent transistors, which may increase the probability of short channel effect (SCE) and/or random dopant fluctuation (RDF). In some previous approaches, a trench (e.g., a recessed channel) may be formed between adjacent transistors to overcome the SCE. However, decreasing the pitch between transistors may also increases the probability of capacitive coupling (disturbs) of adjacent transistors. A trench may not impede, and may even increase, the capacitive coupling of adjacent transistors. Shallow trench isolation (STI) is one technique that may be implemented to isolate devices, such as memory cells and/or transistors, from one another. For instance, STI formation may include formation of (e.g., etching) a trench into a semiconductor material, such as a crystalline silicon substrate, for a semiconductor device.

An isolation trench may be filled using an atomic layer deposition (ALD) technique. Major ALD approaches include a partial ALD material fill followed by a high aspect ratio fill material, and/or insertion of a growth inhibitor per ALD cycle or added chemical. However, the partial fill/high aspect ratio fill requires two toolsets, the growth inhibitor requires longer ALD cycles and the added chemical is slow and has less throughput. The ALD technique may focus on a low oxidization approach to minimize active area consumption. A low oxidization approach may cause void formations in the gapfill of the trench.

The present disclosure includes methods, apparatuses, and systems related to forming a semiconductor using hybrid oxidation in order to mitigate these void formations. A hybrid oxidation may refer to performing a first dielectric deposition at a first oxidation rate and performing a second dielectric deposition at a second oxidation rate. The second dielectric deposition may be performed after the first dielectric deposition. An example of a method described herein includes forming an opening to create an isolation region in a semiconductor substrate. The example method further includes depositing a first dielectric into the isolation region at a first oxidation rate. The example method further includes depositing a second dielectric into the isolation region at a second oxidation rate.

In the following detailed description of the present disclosure, reference is made to the accompanying drawings that form a part hereof, and in which is shown by way of illustration how one or more examples of the disclosure may be practiced. These examples are described in sufficient detail to enable those of ordinary skill in the art to practice the examples of this disclosure, and it is to be understood that other examples may be utilized and that process, electrical, and/or structural changes may be made without departing from the scope of the present disclosure. As used herein, "a number of" something can refer to one or more such things. For example, a number of capacitors can refer to at least one capacitor.

The figures herein follow a numbering convention in which the first digit or digits correspond to the figure number of the drawing and the remaining digits identify an element or component in the drawing. Similar elements or components between different figures may be identified by the use of similar digits. For example, reference numeral 108 may reference element "08" in FIG. 1, and a similar element may be referenced as 308 in FIG. 3. In some instances, a plurality of similar, but functionally and/or structurally distinguishable, elements or components in the same figure or in different figures may be referenced sequentially with the same element number (e.g., 227-1, 227-2, 227-3 in FIG. 2).

FIG. 1 is a cross-sectional view of a semiconductor apparatus 100 with a transistor having asymmetric source/drain regions adjacent to isolation trenches in an example semiconductor fabrication process in accordance with a number of embodiments of the present disclosure. FIG. 1 illustrates neighboring access devices 150 and 152, e.g., memory cell transistors, as may be present in a memory array of a memory device. In the embodiment illustrated in FIG. 1, there are a number of isolation trenches 108-1, 108-2 (collectively or individually referred to as isolation trench 108), which may be used to separate neighboring access devices 150 and 152 from other access devices according to a particular array layout.

FIG. 1 illustrates a first isolation trench 108-1 and a second isolation trench 108-2 but examples are not limited to two isolation trenches and may include various such isolation trenches. Isolation trench 108 may be formed by etching a pattern of the isolation trench 108 into a substrate material 106 and depositing dielectric materials into the trench. In apparatus 100, an isolation trench 108 can be used to prevent electric current leakage between adjacent semiconductor device components. An isolation trench 108 may also increase the capacitive coupling of adjacent semiconductor device components.

Pure semiconductors do not conduct electric current. Adding impurities to a semiconductor material is known as doping. Doping a semiconductor changes the electrical characteristics of the semiconductor and allows it to conduct electricity. Doped semiconductors can become N-type metal-oxide-semiconductors (NMOS) or P-type metal-oxide-semiconductors (PMOS) depending on a dopant type. In n-type semiconductors, negatively charged electrons are the majority carriers and positively charged holes are the minority carriers. In p-type semiconductors, positively charged holes are the majority carriers and negatively charged electrons are the minority carriers. Prior to a doping operation, a plurality of gates 156 and 132 are recessed into the substrate material 106. The gates 156 and 132 can comprise a polymer-silicon material. A gate contact 140 (e.g., tungsten) can be formed on the gates 156 and 132. A gate mask material 138 (e.g., a hard mask material such as a nitride material) can be formed on the gate contact 140. The gate mask material 138 can be used for gate patterning, for example. As shown in FIG. 1, a spacer material 137 can be formed in contact with the gate mask material 138, the gate contact 140, and the gates 156 and 132. The spacer material 137 can comprise a combination of an oxide material and a nitride material.

A metallic material 144 can be formed in contact with the spacer material 137, the source/drain regions 154 and 134, and the junction 133. The dashed line 157 illustrates a conceptual boundary between the source/drain region 158 and the source/drain region 131. However, they may not be a physical boundary between the source/drain region 158 and the source/drain region 131.

An insulation material 146 (e.g., a dielectric material) can be formed on the spacer material 137 and the gate mask material 138, and in contact with the metallic material 144. In at least one embodiment, the metallic material 144 can be formed in contact with the spacer material 137, the source/drain regions 154 and 134, and the junction 133. The insulation material 146 can be formed on the spacer material 137 and the gate mask material 138, and in contact with metallic material 144. A bit line 143 may be formed in contact with the metallic material 144. The bit line 143 may be at least partially formed on the insulation material 146 and the metallic material 144. The bit line or word line (e.g. a word line/gate or a bit line (BL) 143) may be used to read and/or program, e.g., write, refresh, erase, etc. The dashed line 135 illustrates that the bit line 143 is not connected directly to capacitor 139. The metallic material 144 may be connected to the capacitor 139 by curving around the bit line 143. The capacitor 139 may serve as a power source for the access devices below without interfering with the bit line 143 going across. In one example, the bit line 143 is illustrated as extending into and out of the page.

The doping operation can dope the substrate material 106 for a first amount of time. The substrate material 106 can be n+ doped or p+ doped. Although FIG. 1 is described in reference to a single pair of the transistors 150 and 152 formed in the substrate material 106, at least one embodiment includes a plurality of pairs of the gates 156 and 132 of the transistors 150 and 152 formed in the substrate material 106. A doping operation can be performed on the substrate material 106 to dope the substrate material to a depth 159. The junction 133 (e.g., the substrate material 106 between the gates 156 and 132) is also doped to the depth 159. Although FIG. 1 is described in reference to a single pair of the transistors 150 and 152 formed in the substrate material 106, at least one embodiment includes a plurality of pairs of the gates 156 and 132 of the transistors 150 and 152 formed in the substrate material 106.

Doping a semiconductor may result in diffusion and spreading of the dopant to other areas. Diffusion is a process in which dopants introduced into a substrate material spread into other areas. Since in diffusion, a dopant may spread to other areas, the dopant may change the conductive properties of other materials in a manner that was not intended.

Figure 2A:
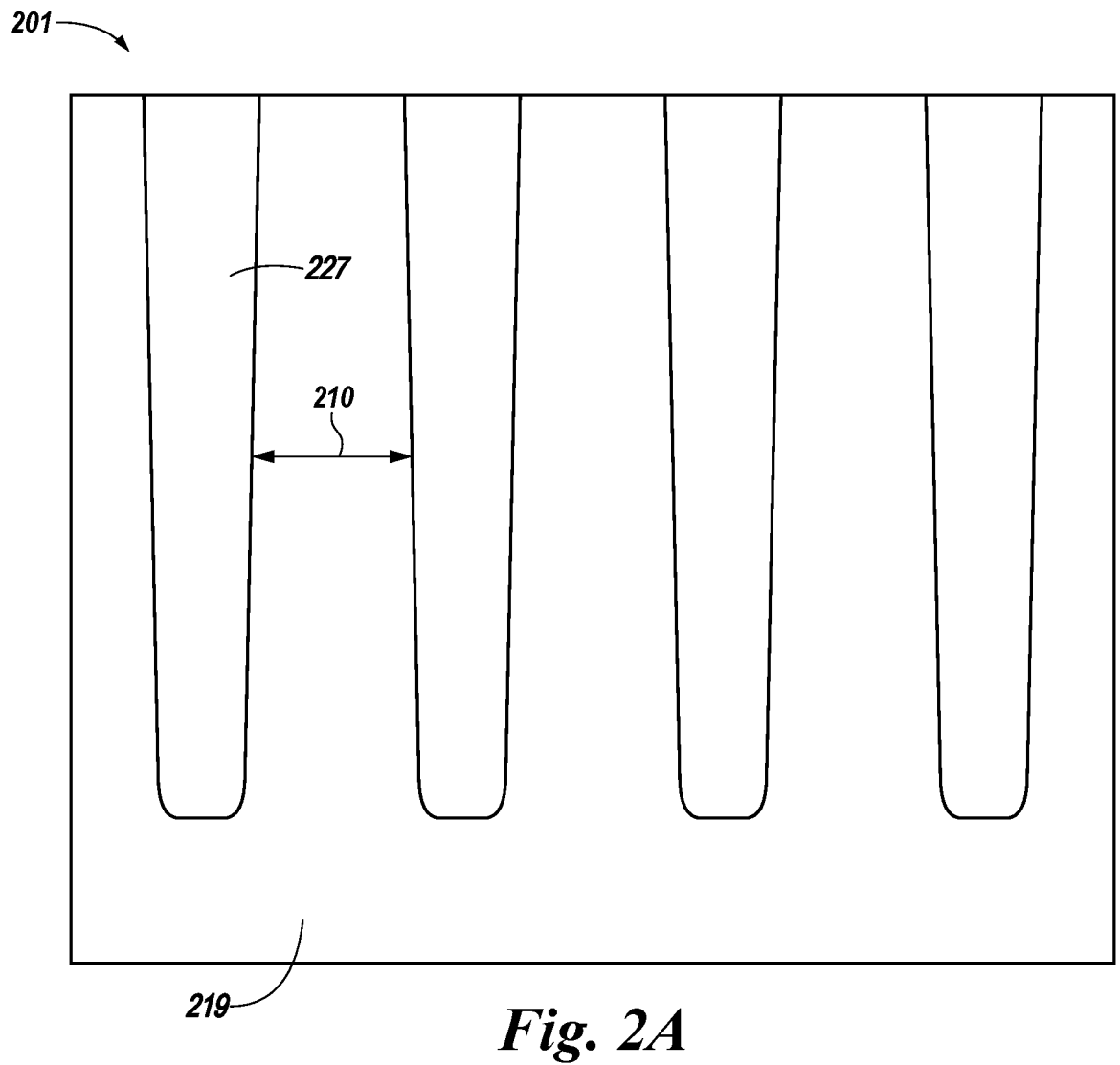
FIGS. 2A-2C illustrate cross-sectional views of a portion of an isolation region in examples of the semiconductor fabrication sequence using a low oxidation process in accordance with previous approaches.

FIG. 2A illustrates a cross-sectional view 201 of a portion of an isolation region in examples of the semiconductor fabrication sequence using a low oxidation process in accordance with previous approaches. FIG. 2A illustrates a close-up view of a plurality of isolation trenches which can include at least some elements that are the same or similar to the example isolation trench 108 as referenced in FIG. 1.

The substrate material 219 may be formed from various undoped or doped materials on which memory device materials may be fabricated. Examples of a relatively inert undoped substrate material 219 may include monocrystalline silicon (monosilicon), polycrystalline silicon (polysilicon), and amorphous silicon, among other possibilities. An opening may be formed into the substrate material 219 to create an isolation trench 227 within the substrate material 219. The depth of the isolation trench 227 may be deeper than the depth of a trench used to form an active area for a bit line or a word line. The space between each isolation trench 227 may be referred to as the active area 210 (collectively or individually referred to as active area 210 or active area width 210).

An active area may be the insulation space between active semiconductor devices. The active areas 210 may be separated by an isolation trench 227. In one example, an isolation trench 227 adjacent to an active area 210 of a semiconductor device (such as an active area including the transistors 150 and 152 as shown in FIG. 1) may include a material with a conductive bias opposing a conductive bias of a channel in the active area 210. The active area may be diminished during oxide deposition of the isolation trench 227.

Figure 2B:
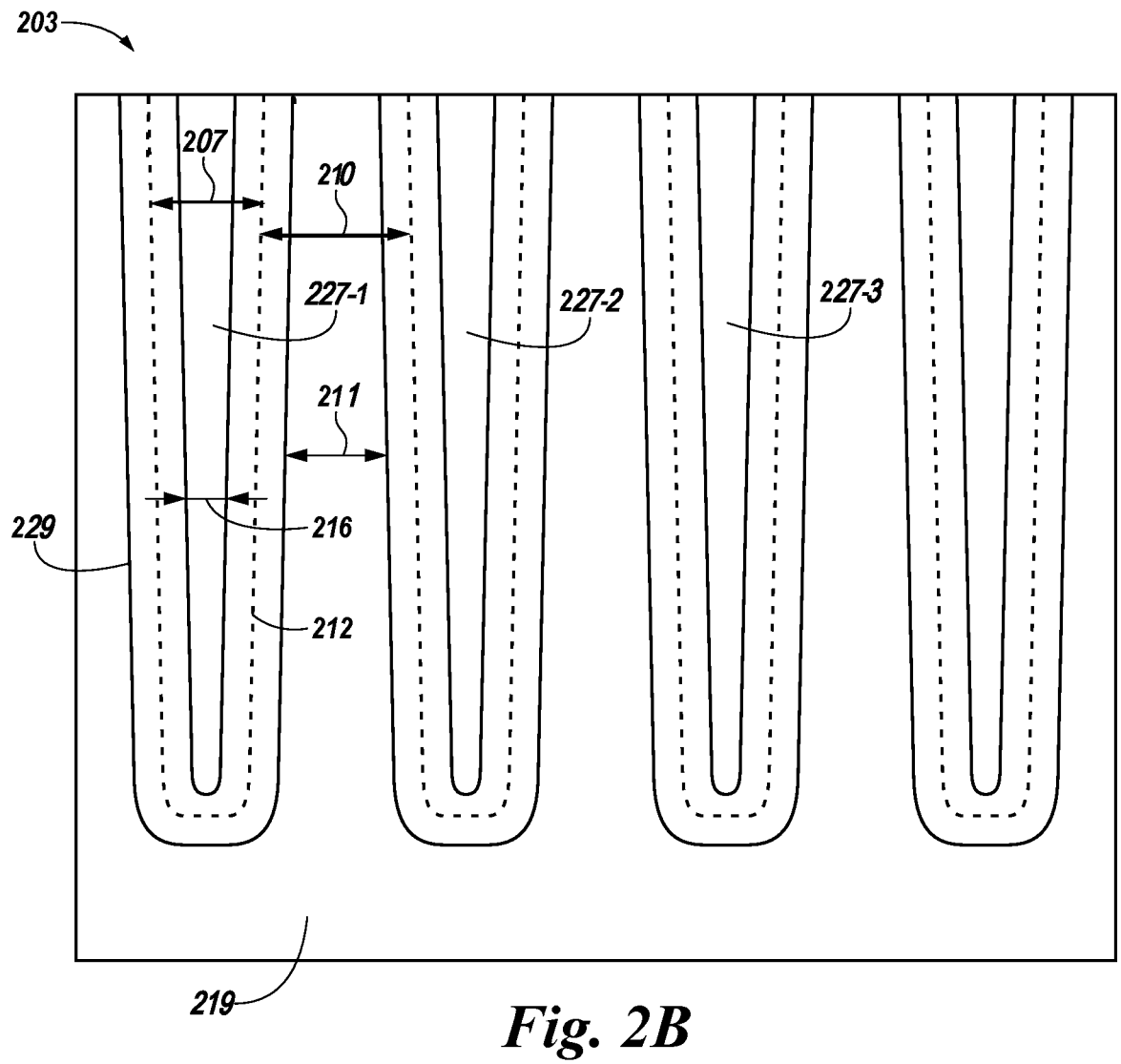

FIG. 2B illustrates a cross-sectional view 203 of a portion of an isolation region in examples of the semiconductor fabrication sequence using a low oxidation process in accordance with the current industry standards. FIG. 2B illustrates a portion of an isolation region at the particular stage following the example fabrication sequence described in connection with FIG. 2.

An isolation trench 227 may be filled using an atomic layer deposition (ALD) technique. In one embodiment, a dielectric may be deposited into the isolation trench 227. The dielectric may be an initial barrier between the substrate material 219 and the other neighboring semiconductor devices and/or components. The dielectric may be an oxide material. An oxide deposition of an isolation trench 227 may be chosen for its ability to erode the silicon of the substrate 219. Also, the silicon oxide material may be used as an insulator or a protective barrier to prevent corrosion of the isolation trench 227. Embodiments are not limited to oxide deposition as other materials that can be used to erode the silicon may also be deposited within the isolation trench 227. However, there may be a chemical reaction when the oxide deposition comes in contact with the silicon substrate 219. That is, there may be a chemical reaction that results from the formation of the silicon oxide material created by the mixture of the isolation trench oxide deposition making contact with the silicon substrate 219. The silicon oxide material may expand the isolation trench 227 such that the initial isolation trench outline 212 may become an expanded isolation trench outline 229.

The expansion of the isolation trench outline (212 to 229) may reduce the active area available. That is, the silicon oxide material may expand into the active area such that the active area is reduced from an active area width 210 to a reduced active area width 211. The silicon oxide material may also expand into the width 207 within the isolation trench 227. As an example, the width 207 of the isolation trench 227 may be reduced by the expansion of the silicon oxide volume inside the isolation trench 227. After the silicon oxide material forms and expands, the width 207 of the isolation trench 227 may be reduced from an initial isolation trench width 207 to a reduced isolation trench width 216.

Figure 2C:
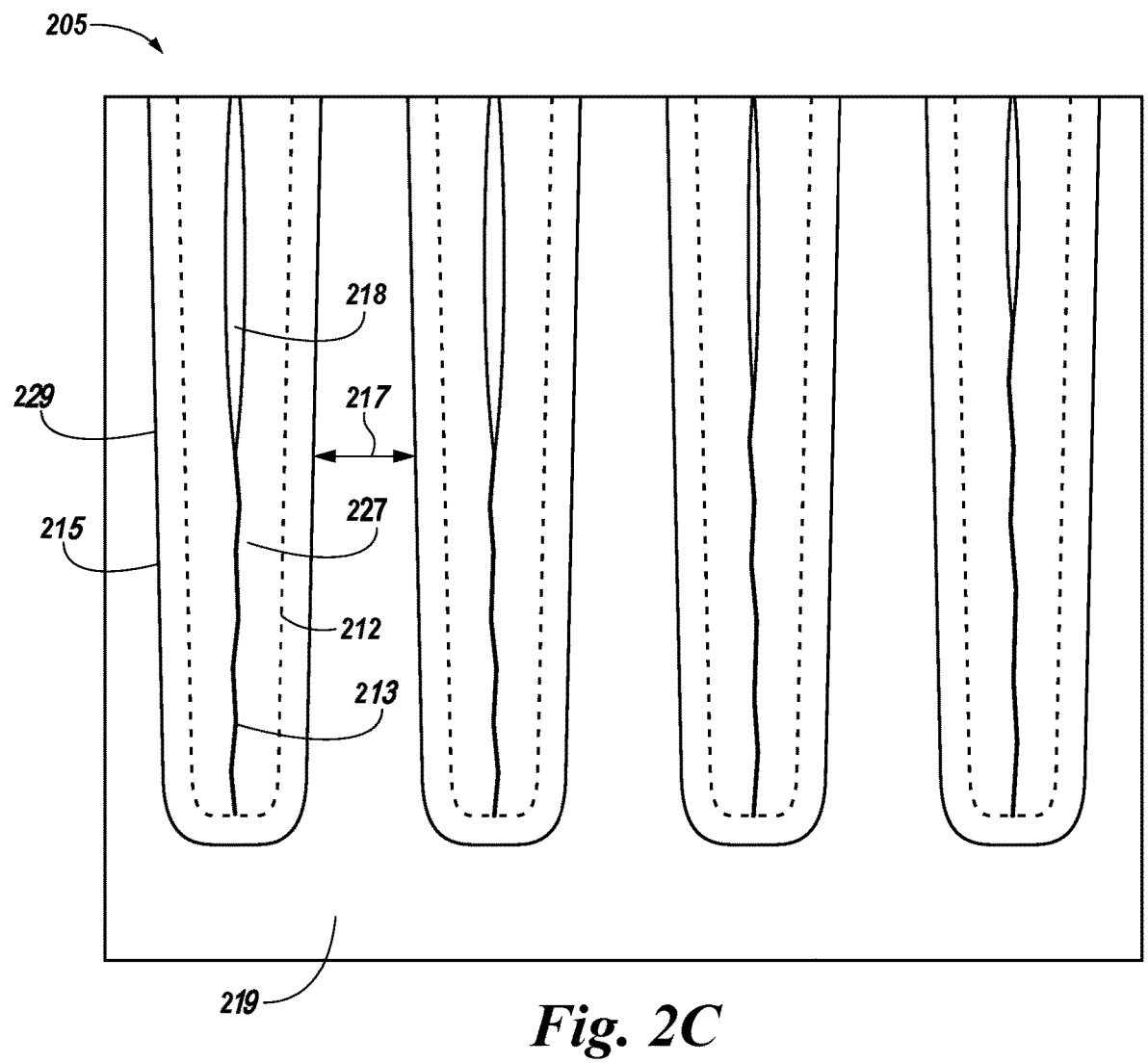

FIG. 2C illustrates a cross-sectional view 205 of a portion of an isolation region in examples of the semiconductor fabrication sequence using a low oxidation process in accordance with the current industry standards. FIG. 2C illustrates a structure of the portion of the example memory device following completion of the example fabrication sequence described in connection with FIG. 2B.

As the silicon oxide material continues to expand, the isolation trench 227 may be overtaken until only a seam is remaining. The width of the active area 217 may be further reduced by the expansion of the silicon oxide material within the isolation trench 227. As the volume of the silicon oxide material within the isolation trench 227 continues to expand aided by the active area loss due to the silicon oxide material deposition cycles, the width of the isolation trench 227 may be reduced to a width 217. The silicon oxide material may expand the isolation trench 227 such that the initial isolation trench outline 212 may become a more expanded isolation trench outline 215. That is, the silicon oxide material may expand past the previous expanded isolation trench outline (e.g., trench outline 229 in FIG. 2B). The silicon oxide material may erode the width of the isolation trench 227 until it becomes a seam 213. The seam 213 may begin to form a void 218 at the top of the isolation trench 227. The void 218 may be formed in the gapfill of the isolation trench 227. The void 218 may decrease the performance of the isolation trench 227.

In some previous approaches, the ALD technique may use a low oxidation approach to minimize active area consumption. However, a low oxidization approach may cause formation of the void 218 in the gapfill of the isolation trench 227. To address and improve the performance of the isolation trench 227, methods can include creating a void-free isolation trench 227. Major ALD approaches may include a partial ALD material fill followed by a high aspect ratio fill material or insertion of a growth inhibitor per ALD cycle or added chemical. However, the partial fill/high aspect ratio fill may use two toolsets, the growth inhibitor may use longer ALD cycles, and the added chemical may be slow and result in less throughput.

Figure 3:
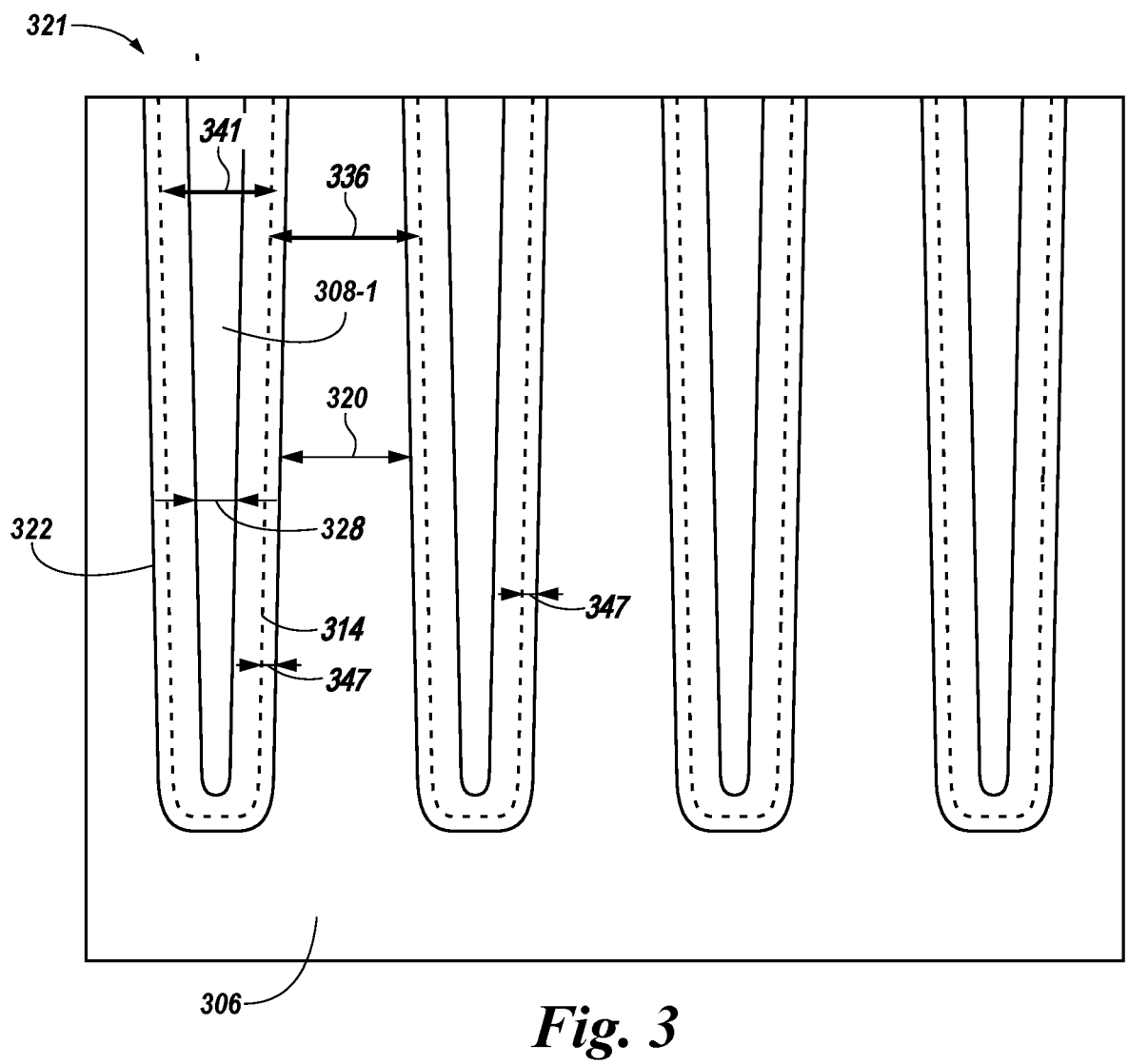
FIGS. 3-5 illustrate cross-sectional views of a portion of an isolation region in examples of the semiconductor fabrication sequence using hybrid oxidation in accordance with a number of examples of the present disclosure.

FIG. 3 illustrates a cross-sectional view 321 of a portion of an isolation region in another example of the semiconductor fabrication sequence using hybrid oxidation in accordance with a number of examples of the present disclosure. FIG. 3 illustrates a close-up view of a plurality of isolation trenches as described in connection with FIG. 1.

The cross-sectional view 321 can include the same or similar elements as the example cross-sectional view 100 as referenced in FIG. 1. For example, the isolation trench 308 is analogous or similar to isolation trench 108 in FIG. 1. The substrate 306 is analogous or similar to isolation trench 106 in FIG. 1

The substrate material 306 may be formed from various undoped or doped materials on which memory device materials may be fabricated. Examples of a relatively inert undoped substrate material 306 may include monocrystalline silicon (monosilicon), polycrystalline silicon (polysilicon), and amorphous silicon, among other possibilities. The substrate material 306 may have a thickness of approximately 100-150 Angstroms (10-15 nm). An opening may be formed into the substrate material 306 to create an isolation trench 308 within the substrate material 306. The depth of the isolation trench 308 may be deeper than the depth of a trench used to form an active area for a bit line or a word line. In at least one example, the width or diameter of the isolation trench 308 may be within a range of from approximately 200-300 Angstroms (or 20 to 40 nm) and the height of the isolation trench 308 may be within a range of from approximately 2,000-3,000 Angstroms (200-300 nm) and may result in an aspect ratio (AR) of the height to width being in a range of from around 5:1 to around 10:1. However, embodiments are not so limited and other ranges may be used for particular applications or design rules.

The space between each isolation trench 308 may be referred to as the active area 336 (collectively or individually referred to as active area 336 or active area width 336). An active area may be the insulation space between active semiconductor devices. The active areas 336 may be separated by an isolation trench 308. The pitch/distance between each isolation trench 308 may be a range from approximately 100-1,000 Angstroms (10-100 nm).

In this example, an initial phase of the ALD may include a first dielectric deposition into the isolation trench 308. The first dielectric deposition may be performed into the isolation trench at a first oxidation rate. The first dielectric deposition may be a low oxidization deposition. The low oxidization deposition may be an initial barrier between the substrate material 306 and the other neighboring semiconductor devices and/or components. The low oxidization deposition may be created with a mixture having a hydrogen to oxygen ratio of 70-80% hydrogen to 20 to 30% oxygen.

The low oxidization deposition may be chosen for its ability to erode the substrate material 306 formed out of silicon. There may be a chemical reaction when the low oxidization deposition within the isolation trench 308 contacts the silicon substrate 306. That is, there may be a chemical reaction that results from the formation of the silicon oxide material created by the mixture of the low oxidization deposition contacting the silicon substrate 306. The silicon oxide material may expand the isolation trench 308 such that the initial isolation trench outline 314 may become an expanded isolation trench outline 322.

The expansion of the isolation trench outline (314 to 322) may reduce the active area 336 available. That is, the silicon oxide material may expand into the active area 336 such that the active area is reduced from an active area width 336 to a reduced active area width 320. The silicon oxide material may also expand into the width within the isolation trench 308. The width of the isolation trench 308 may be reduced by the expansion of the silicon oxide material. After the silicon oxide material forms and expands, the width of the isolation trench 308 may be reduced from an initial isolation trench width 341 to a reduced isolation trench width 328.

A low oxidization deposition may consume less silicon and may minimize consumption of the active area 320 by the silicon oxide material. The silicon oxide material may be formed from the contact of the isolation trench oxide deposition and the silicon substrate 306. The low oxidization mixture may be used for half the ALD cycle. The low oxidization mixture may be used for the first half of the ALD cycle. The ALD cycle may be determined based on the isolation trench critical dimension widths and the oxidization rate. An initial low oxidization cycle can last for a range between 20-50 seconds per cycle. During the low oxidization cycle of the ALD process, a buffer area 347 may be created between the silicon substrate 306 and the isolation trench oxide deposition without significant silicon oxide material encroachment within the active area. The buffer area 347, a silicon oxide material, may have a thickness of a range from approximately 20-30 Angstroms (2-3 nm).

Figure 4:
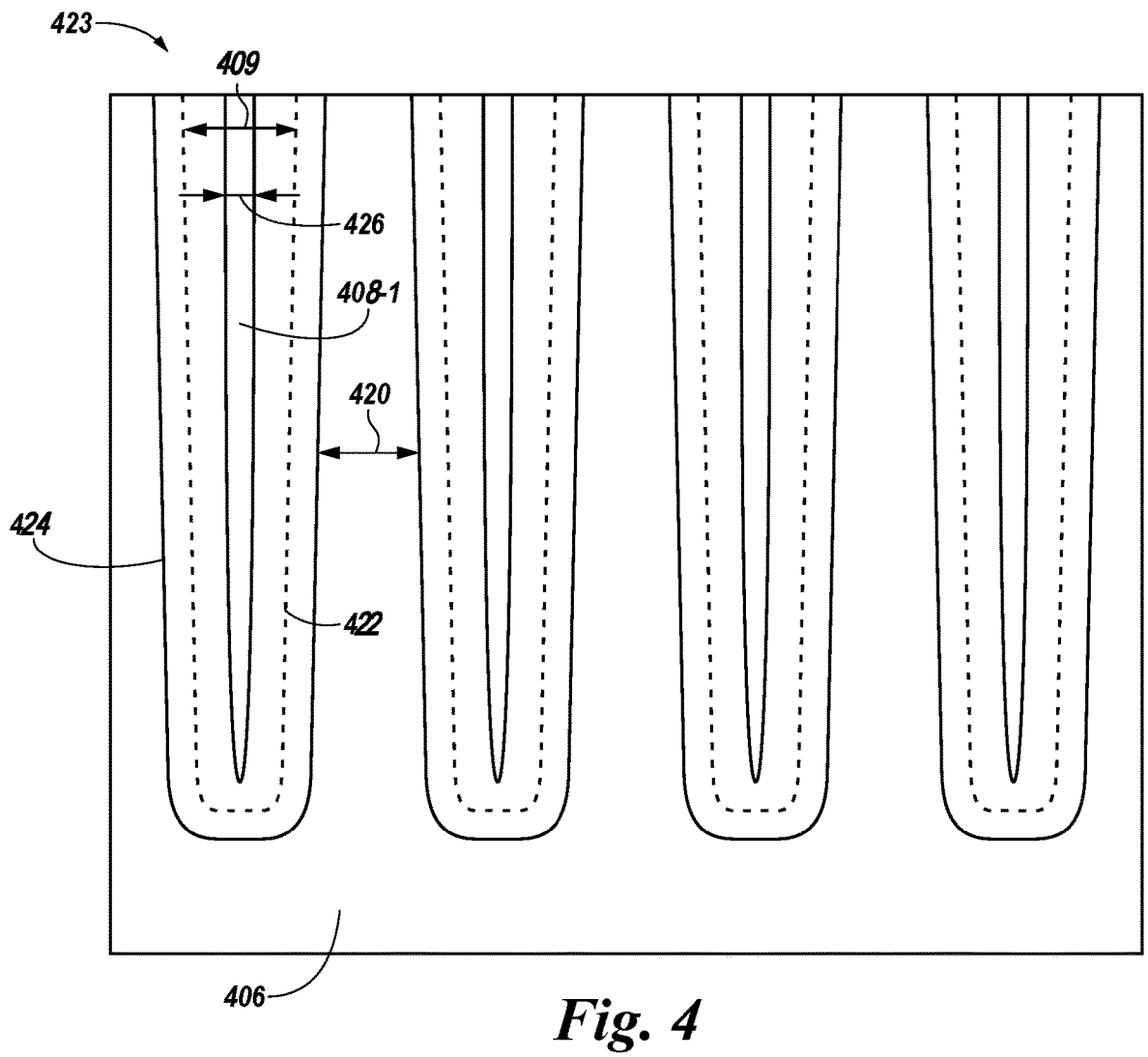

FIG. 4 illustrates cross-sectional view 423 of a portion of an isolation region in another example of the semiconductor fabrication sequence using hybrid oxidation in accordance with a number of examples of the present disclosure. FIG. 4 illustrates a structure of the portion of the example isolation region following completion of the example fabrication sequence described in connection with FIG. 3.

The cross-sectional view 423 can include the same or similar elements as the example cross-sectional views 100 and 321 as referenced in FIGS. 1 and 3 respectively. For example, the isolation trench 408 is analogous or similar to isolation trench 108 and 308 in FIGS. 1 and 3, respectively. The substrate 406 is analogous or similar to isolation trench 106 and 306 in FIGS. 1 and 3, respectively.

In this example, a second dielectric deposition may be performed into the isolation trench 408. The second dielectric deposition may be a high oxidization deposition. The high oxidization mixture may be the second deposition into the isolation trench 408 in the multi-step hybrid oxidization process. The high oxidization mixture may be deposited after the low oxidization mixture. A high oxidization fill may be formed with a mixture having a hydrogen to oxygen ratio of 18-33% hydrogen to 80 to 67% oxygen. A high oxidization mixture may consume more silicon but diminishes void formation and improves gap fill. The high oxidization mixture may also expand the volume of the isolation trench 408.

The second dielectric deposition may be performed into the isolation trench at a second oxidation rate. The high oxidization mixture may be used for half the ALD cycle. The high oxidization mixture may be used for the second half of the ALD cycle. The high oxidization cycle can last for a range between 20-50 seconds per cycle. The high oxidization cycle may last the same time as the low oxidization cycle. The high oxidization cycle and the low oxidization cycle may be performed as a combined process, not as two separate tools. The high oxidization cycle may be performed immediately after the low oxidization cycle. The total ALD cycle may last between 40-70 seconds per cycle for both the high oxidization and the low oxidization cycle.

During the high oxidization cycle, the silicon oxide material may expand the isolation trench 408 such that the initial isolation trench outline 422 may become an expanded isolation trench outline 424. The initial isolation trench outline 422 may be the same as the expanded isolation trench outline (322 of FIG. 3) from the low oxidization cycle. The width of the isolation trench 408 may reduce from an initial isolation trench width 409 to a reduced isolation trench width 426. The rapid expansion of the silicon oxide material may continue to reduce the active area available. That is, the silicon oxide material may expand into the active area such that the active area is reduced from an active area width 411 to a reduced active area width 420. However, the high oxidization cycle may stop the isolation trench width from becoming a seam too rapidly and creating a void. While the width of the isolation trench 408 may be reduced by the expansion of the silicon oxide material, the width of the isolation trench 408 does not become a seam. The high oxidization cycle may have a width 426. The combination of the hybrid oxidization cycles may prevent erosion of the active area by a range from approximately 5-20 Angstroms (0.5-2 nm).

Figure 5:
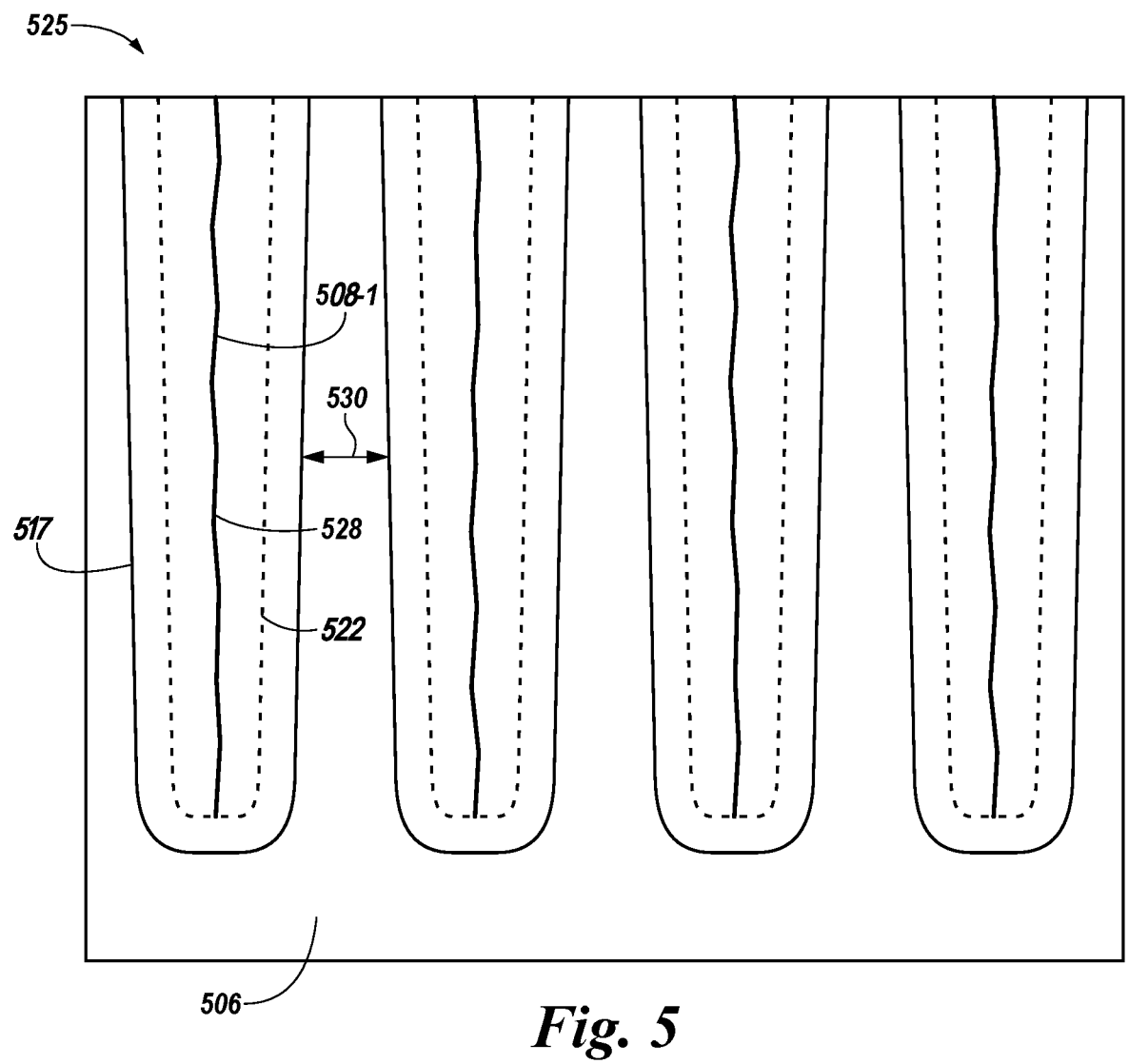

FIG. 5 illustrates cross-sectional view 525 of a portion of an isolation region in another example of the semiconductor fabrication sequence using hybrid oxidation in accordance with a number of examples of the present disclosure. FIG. 5 illustrates a structure of the portion of the isolation region following completion of the example fabrication sequence described in connection with FIG. 4.

The cross-sectional view 525 can include the same or similar elements as the example cross-sectional views 100, 321, 423 and 525 as referenced in FIGS. 1, 3, and 4 respectively. For example, the isolation trench 508 is analogous or similar to isolation trench 108, 308, and 408 in FIGS. 1, 3, and 4 respectively. The substrate 506 is analogous or similar to isolation trench 106, 306, and 406 in FIGS. 1, 3, and 4.

As the silicon oxide material continues to expand, the isolation trench 508 may be overtaken until only a seam is remaining. The width of the active area may be further reduced by the expansion of the silicon oxide material. As the silicon oxide material continues to expand, the width of the active area may be reduced to a width 530. The silicon oxide material may expand the isolation trench 508 such that the initial isolation trench outline 524 may become a more expanded isolation trench outline 517. The initial isolation trench outline 524 may be the same as the expanded isolation trench outline (424 of FIG. 4) from the high oxidization cycle. That is, the silicon oxide material may expand past the previous expanded isolation trench outline 524.

While the silicon oxide material may erode the width of the isolation trench 508 until it becomes a seam, there is no void formation in the isolation trench due to the hybrid oxidization process. The rate of silicon oxide material expansion may be lower for the hybrid oxidization cycles where seam is formed before a void occurs in comparison to a situation where the seam is not yet formed. That is, deposition of the low oxidization cycle prior to the deposition of the high oxidization cycle may allow a semiconductor ALD process of an isolation trench 508 while conserving the active area and without formation of a void.

Figure 6:
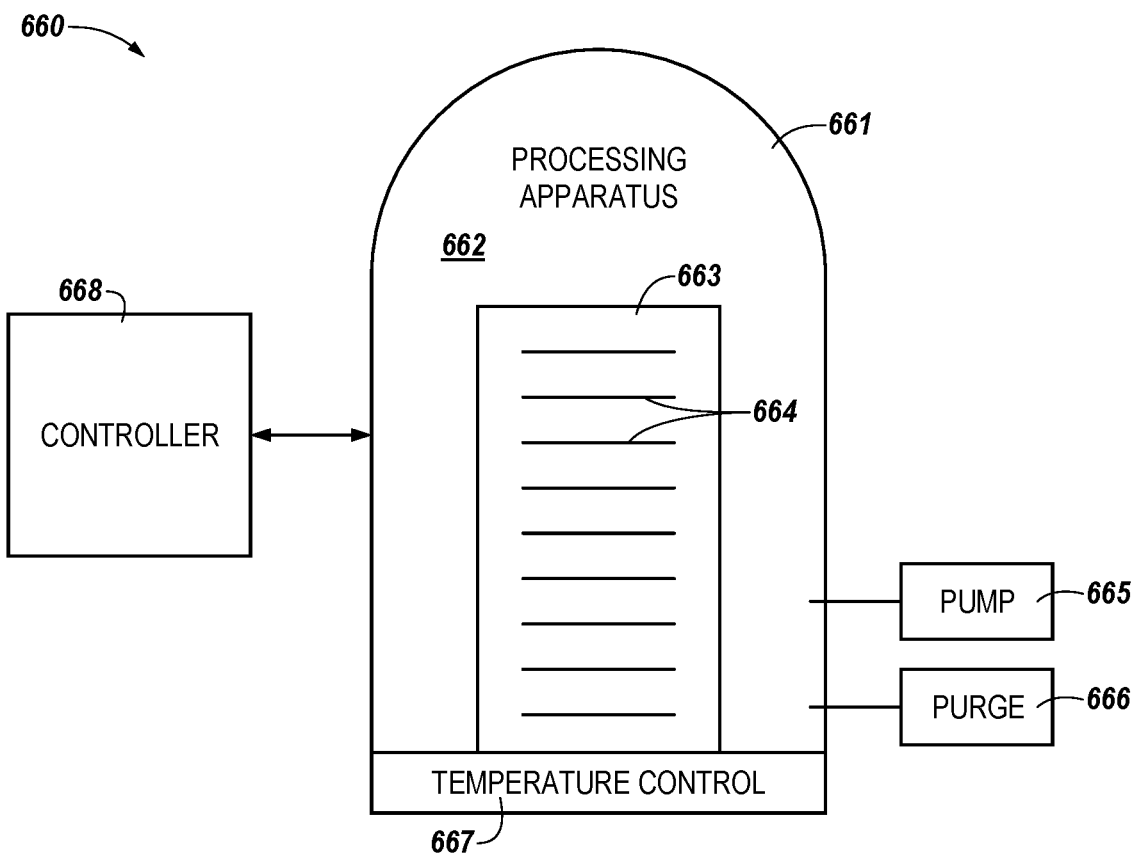
FIG. 6 is a functional block diagram of a system for implementation of an example semiconductor fabrication process in accordance with a number of embodiments of the present disclosure.

FIG. 6 is a functional block diagram of a system 660 for implementation of an example semiconductor fabrication process in accordance with a number of embodiments of the present disclosure. The system 660 can include a processing apparatus 661. The processing apparatus 661 can be configured to enable formation a semiconductor using hybrid oxidation.

The processing apparatus 661 can include a semiconductor processing chamber 662 to enclose components configured to form a semiconductor using hybrid oxidation. The chamber 662 can further enclose a carrier 663 to hold a batch of semiconductor wafers 664 (e.g., the substrate material 106). The processing apparatus 661 can include and/or be associated with tools including, for example, a pump 665 unit and a purge 666 unit configured to introduce and remove reducing agents. The processing apparatus 661 can further include a temperature control 667 unit configured to maintain the chamber 662 at appropriate temperatures as described herein.

The system 660 can further include a controller 668. The controller 668 can include, or be associated with, circuitry and/or programming for implementation of, for instance, formation of a semiconductor using hybrid oxidation. Adjustment of such deposition and purging operations by the controller 668 can control the thickness of the materials described herein (such as the isolation trench deposition).

The controller 668 can, in a number of embodiments, be configured to use hardware as control circuitry. Such control circuitry may, for example, be an application specific integrated circuit (ASIC) with logic to control fabrication steps, via associated deposition and purge processes, for formation of a semiconductor using hybrid oxidation.

Figure 7:
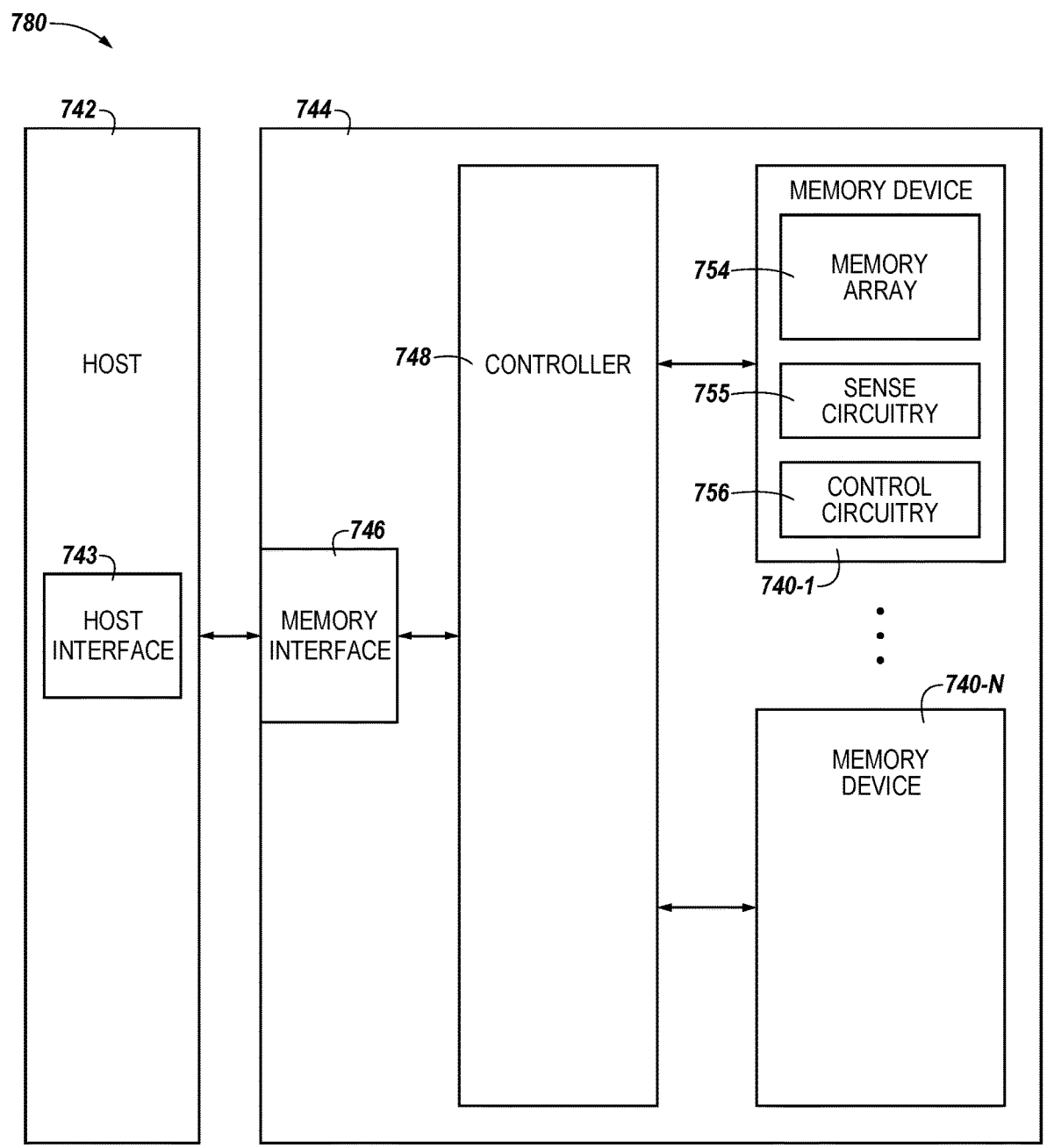
FIG. 7 illustrates a functional block diagram of an example computing system including a semiconductor structure of a memory system in accordance with a number of examples of the present disclosure.

FIG. 7 is a functional block diagram of a computing system 780 including at least one memory system 744 in accordance with one or more examples of the present disclosure. Memory system 744 may be, for example, a solid-state drive (SSD).

In the example illustrated in FIGS. 1-5, memory system 744 includes a memory interface 746, a number of memory devices 740-1, . . . , 740-N, and a controller 748 selectably coupled to the memory interface 746 and memory devices 740-1, . . . , 740-N. Memory interface 746 may be used to communicate information between memory system 744 and another device, such as a host 742. Host 742 may include a processor (not shown). As used herein, "a processor" may be a number of processors, such as a parallel processing system, a number of coprocessors, etc. Example hosts may include, or by implemented in, laptop computers, personal computers, digital cameras, digital recording devices and playback devices, mobile telephones, PDAs, memory card readers, interface hubs, and the like. Such a host may be associated with fabrication operations performed on semiconductor devices and/or SSDs using, for example, a processing.

In a number of examples, host 742 may be associated with (e.g., include or be coupled to) a host interface 743. The host interface 743 may enable input of scaled preferences (e.g., in numerically and/or structurally defined gradients) to define, for example, critical dimensions (CDs) of a final structure or intermediary structures of a memory device (e.g., as shown at 740) and/or an array of memory cells (e.g., as shown at 754) formed thereon to be implemented by the processing apparatus. The scaled preferences may be provided to the host interface 743 via input of a number of preferences stored by the host 742, input of preferences from another storage system (not shown), and/or input of preferences by a user (e.g., a human operator).

Memory interface 746 may be in the form of a standardized physical interface. For example, when memory system 744 is used for information (e.g., data) storage in computing system 980, memory interface 746 may be a serial advanced technology attachment (SATA) interface, a peripheral component interconnect express (PCIe) interface, or a universal serial bus (USB) interface, among other physical connectors and/or interfaces. In general, however, memory interface may provide an interface for passing control, address, information, scaled preferences, and/or other signals between the controller 748 of memory system 744 and a host 742 (e.g., via host interface 743).

Controller 748 may include, for example, firmware and/or control circuitry (e.g., hardware). Controller 748 may be operably coupled to and/or included on the same physical device (e.g., a die) as one or more of the memory devices 740-1, . . . , 740-N. For example, controller 748 may be, or may include, an ASIC as hardware operably coupled to circuitry (e.g., a printed circuit board) including memory interface 746 and memory devices 740-1, . . . , 740-N. Alternatively, controller 748 may be included on a separate physical device that is communicatively coupled to the physical device (e.g., the die) that includes one or more of the memory devices 740-1, . . . , 740-N.

Controller 748 may communicate with memory devices 740-1, . . . , 740-N to direct operations to sense (e.g., read), program (e.g., write), and/or erase information, among other functions and/or operations for management of memory cells. Controller 748 may have circuitry that may include a number of integrated circuits and/or discrete components. In a number of examples, the circuitry in controller 748 may include control circuitry for controlling access across memory devices 740-1, . . . , 740-N and/or circuitry for providing a translation layer between host 942 and memory system 944.

Memory devices 740-1, . . . , 740-N may include, for example, a number of memory arrays 754 (e.g., arrays of volatile and/or non-volatile memory cells). For instance, memory devices 740-1, . . . , 740-N may include arrays of memory cells, such as a portion of an example memory device 790 structured to form structures formed according to embodiments described in FIGS. 1-5, described in connection with FIG. 7. As will be appreciated, the memory cells in the memory arrays 754 of memory devices 740-1, . . . , 740-N may be in a RAM architecture (e.g., DRAM, SRAM, SDRAM, FeRAM, MRAM, ReRAM, etc.), a flash architecture (e.g., NAND, NOR, etc.), a three-dimensional (3D) RAM and/or flash memory cell architecture, or some other memory array architecture including pillars and adjacent trenches.

Memory devices 740 may be formed on the same die. A memory device (e.g., memory device 740-1) may include one or more arrays 754 of memory cells formed on the die. A memory device may include sense circuitry 755 and control circuitry 756 associated with one or more arrays 754 formed on the die, or portions thereof. The sense circuitry 755 may be utilized to determine (sense) a particular data value (e.g., 0 or 1) that is stored at a particular memory cell in a row of an array 754. The control circuitry 756 may be utilized to direct the sense circuitry 755 to sense particular data values, in addition to directing storage, erasure, etc., of data values in response to a command from host 742 and/or host interface 743. The command may be sent directly to the control circuitry 756 via the memory interface 746 or to the control circuitry 756 via the controller 748.

The example illustrated in FIG. 7 may include additional circuitry that is not illustrated so as not to obscure examples of the present disclosure. For example, memory devices 740 may include address circuitry to latch address signals provided over I/O connectors through I/O circuitry. Address signals may be received and decoded by a row decoder and a column decoder to access a memory array 754. It will be appreciated that the number of address input connectors may depend on the density and/or architecture of memory devices 740 and/or memory arrays 754.

In the above detailed description of the present disclosure, reference is made to the accompanying drawings that form a part hereof, and in which is shown by way of illustration how one or more examples of the disclosure may be practiced. These examples are described in sufficient detail to enable those of ordinary skill in the art to practice the examples of this disclosure, and it is to be understood that other examples may be utilized and that process, electrical, and/or structural changes may be made without departing from the scope of the present disclosure.

It is to be understood that the terminology used herein is for the purpose of describing particular examples only and is not intended to be limiting. As used herein, the singular forms "a", "an", and "the" include singular and plural referents, unless the context clearly dictates otherwise, as do "a number of", "at least one", and "one or more" (e.g., a number of memory arrays may refer to one or more memory arrays), whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically and, unless stated otherwise, can include a wireless connection for access to and/or for movement (transmission) of instructions (e.g., control signals, address signals, etc.) and data, as appropriate to the context.

While example examples including various combinations and configurations of semiconductor materials, underlying materials, structural materials, dielectric materials, capacitor materials, substrate materials, silicate materials, nitride materials, buffer materials, etch chemistries, etch processes, solvents, memory devices, memory cells, sidewalls of openings and/or trenches, among other materials and/or components related to formation of a capacitor using a sacrificial material have been illustrated and described herein, examples of the present disclosure are not limited to those combinations explicitly recited herein. Other combinations and configurations of the semiconductor materials, underlying materials, structural materials, dielectric materials, capacitor materials, substrate materials, silicate materials, nitride materials, buffer materials, etch chemistries, etch processes, solvents, memory devices, memory cells, sidewalls of openings and/or trenches related to use of a sacrificial material in formation of a capacitor than those disclosed herein are expressly included within the scope of this disclosure.

Although specific examples have been illustrated and described herein, those of ordinary skill in the art will appreciate that an arrangement calculated to achieve the same results may be substituted for the specific examples shown. This disclosure is intended to cover adaptations or variations of one or more examples of the present disclosure. It is to be understood that the above description has been made in an illustrative fashion, and not a restrictive one. Combination of the above examples, and other examples not specifically described herein will be apparent to those of skill in the art upon reviewing the above description. The scope of the one or more examples of the present disclosure includes other applications in which the above structures and processes are used. Therefore, the scope of one or more examples of the present disclosure should be determined with reference to the appended claims, along with the full range of equivalents to which such claims are entitled.

In the foregoing Detailed Description, some features are grouped together in an example for the purpose of streamlining the disclosure. This method of disclosure is not to be interpreted as reflecting an intention that the disclosed examples of the present disclosure have to use more features than are expressly recited in each claim. Rather, as the following claims reflect, inventive subject matter lies in less than all features of a disclosed example. Thus, the following claims are hereby incorporated into the Detailed Description, with each claim standing on its own as a separate example.

What is claimed is:

1. A method of forming semiconductor structures, comprising:
    forming an opening to create an isolation region in a semiconductor substrate;
    performing a first portion of an atomic layer deposition (ALD) at a first oxidation rate into the isolation region;
    performing a second portion of the ALD at a second oxidation rate into the isolation region to form a void-free isolation trench; and
    forming a buffer area between the semiconductor substrate and the isolation region during performance of the first portion of the ALD.

2. The method of claim 1, wherein the first portion of the ALD is performed during a time period between 20-50 seconds.

3. The method of claim 1, wherein the second portion of the ALD is performed during a time period between 20-50 seconds.

4. The method of claim 1, further comprising determining a duration of the first portion and the second portion of the ALD based on an isolation trench width.

5. The method of claim 1, further comprising performing the first portion and the second portion of the ALD for a duration of a range between 40-70 seconds.

6. The method of claim 1, further comprising performing the first portion at the first oxidization rate with the same timing as the second portion at the second oxidization rate.

7. A method of forming semiconductor structures, comprising:
    forming an opening to create an isolation region in a semiconductor substrate;
    performing a first portion of an atomic layer deposition (ALD) at a first oxidation rate into the isolation region;
    performing a second portion of the ALD at a second oxidation rate into the isolation region to form a void-free isolation trench; and
    forming a buffer area with a thickness of a range between 2 nm and 3 nm between the semiconductor substrate and the isolation region during performance of the first portion of the ALD.

8. The method of claim 7, further comprising forming the opening with a height range between 2,000 and 3,000 Angstroms.

9. The method of claim 7, wherein performing the first portion of the ALD comprises depositing a silicon oxide (SiO) material.

10. The method of claim 7, wherein performing the first portion of the ALD prior to the second portion of the ALD prevents erosion of an active area for a capacitor trench by a range of 0.5 nm to 2 nm.

11. The method of claim 7, further comprising reducing silicon consumption during the performance of the first portion and the second portion of the ALD.

12. The method of claim 7, wherein forming the opening to create the isolation region, comprises forming the isolation region with a height to width ratio of 10 nm to 1 nm.

13. The method of claim 7, wherein forming the opening to create the isolation region comprises forming a distance of a range between 10 to 100 nm between a first isolation region and a second isolation region.

14. The method of claim 7, further comprising performing the second portion of the ALD at a second oxidation rate expands a volume of the isolation region.

* * * * *